United States Patent [19]
Chen et al.

[11] Patent Number: 5,828,675
[45] Date of Patent: Oct. 27, 1998

[54] VITERBI DECODER CIRCUIT

[75] Inventors: Franz C. Chen, San Jose; Roy G. Batruni, Fremont, both of Calif.

[73] Assignee: National Semiconductor Corporation, Santa Clara, Calif.

[21] Appl. No.: 870,831

[22] Filed: Jun. 6, 1997

[51] Int. Cl.$^6$ .................................................. H01S 3/10
[52] U.S. Cl. .................. 371/28; 371/43.7; 371/43.5; 371/43.6; 375/341; 375/262; 704/242
[58] Field of Search .............. 371/28, 43.7, 43.5, 371/43.6; 375/341, 262; 704/242

[56] References Cited

U.S. PATENT DOCUMENTS

| | | | |
|---|---|---|---|
| 4,757,506 | 7/1988 | Heihler | 371/43 |
| 5,428,631 | 6/1995 | Zehavi | 371/43 |
| 5,469,452 | 11/1995 | Zehavi | 371/43 |

*Primary Examiner*—Paul P. Gordon
*Assistant Examiner*—McDieunel Marc
*Attorney, Agent, or Firm*—Limbach & Limbach L.L.P.

[57] ABSTRACT

A Viterbi decoder circuit for decoding an encoded data signal containing Viterbi branch metric information includes a configurable memory which is alternately configured to have four stages of memory in which the incoming data signal is stored and selectively read out based upon Viterbi trellis address information contained therein. While the present data of the incoming data signal is being stored in one memory stage, individual bits from selected bytes of previously stored incoming data are read out from a second memory stage and used to form the next address for the second memory stage and an address for a third memory stage from which further previously stored incoming data are read out and decoded to form the final Viterbi-decoded data. Starting from an arbitrarily selected initial address within the second memory stage, each bit which is read out contains address information corresponding to a Viterbi trellis address and determines the next address within the second memory stage from which the next bit is to be read.

12 Claims, 4 Drawing Sheets

VITERBI DECODER CIRCUIT

BACKGROUND OF THE INVENTION

1. Field of the Invention

The present invention relates to Viterbi detectors, and in particular, to Viterbi detectors having Viterbi decoder circuits which store and then selectively read out historical detected data containing Viterbi branch metric information.

2. Description of the Related Art

Data recovery from synchronous data channels, such as those used in telecommunications and magnetic data recovery (e.g., computer disk drives), is often performed with an equalizer or a Viterbi detector, or a combination of both. For those which require the use of a Viterbi detector, common problems include implementing the complex circuit structures which are generally associated with Viterbi decoder circuits, as well as the significant power consumption associated with such circuit structures. Hence, while the use of Viterbi branch metric information can be advantageous for recovering data, the necessary algorithms and circuit structures make the use of such information difficult and expensive.

Accordingly, it would be desirable to have a Viterbi decoder circuit for using Viterbi branch metric information to recover synchronous data but which has a significantly less complex circuit structure and algorithm, as well as reduced power consumption.

SUMMARY OF THE INVENTION

A Viterbi decoder circuit in accordance with the present invention advantageously uses Viterbi branch metric information contained within a data signal to store and subsequently address and read out such data with a reconfigurable memory.

In accordance with one embodiment of the present invention, a Viterbi decoder circuit for decoding an encoded data signal containing Viterbi branch metric information includes a configurable memory circuit and a data addressing circuit. The configurable memory circuit includes a plurality of portions individually and alternately configured to operate as a respective one of first, second and third memory stages and is configured to receive an encoded data signal and to receive first and second address signals and in accordance therewith provide first and second data signals, respectively. The encoded data signal includes a plurality of input data sets, the first and second address signals represent first and second sets of memory addresses, respectively, within the configurable memory circuit, and the first and second data signals contain first and second pluralities of data sets, respectively. The first memory stage is configured to store each one of a portion of the plurality of input data sets individually in a respective portion thereof. The second memory stage is configured to provide a portion of a first previously stored portion of the plurality of input data sets from one of the first plurality of memory addresses as one of the first plurality of data sets. The third memory stage is configured to provide a portion of a second previously stored portion of the plurality of input data sets from one of the second plurality of memory addresses as one of the second plurality of data sets. The data addressing circuit is coupled to the configurable memory circuit and is configured to provide the first address signal and in accordance therewith receive the first data signal and in accordance therewith provide the second address signal and in accordance therewith receive and decode the second data signal and in accordance therewith provide an output data signal. Each one of the first plurality of memory addresses corresponds to a previous one of the first plurality of data sets.

These and other features and advantages of the present invention will be understood upon consideration of the following detailed description of the invention and the accompanying drawings.

DETAILED DESCRIPTION OF THE INVENTION

Figure 1:
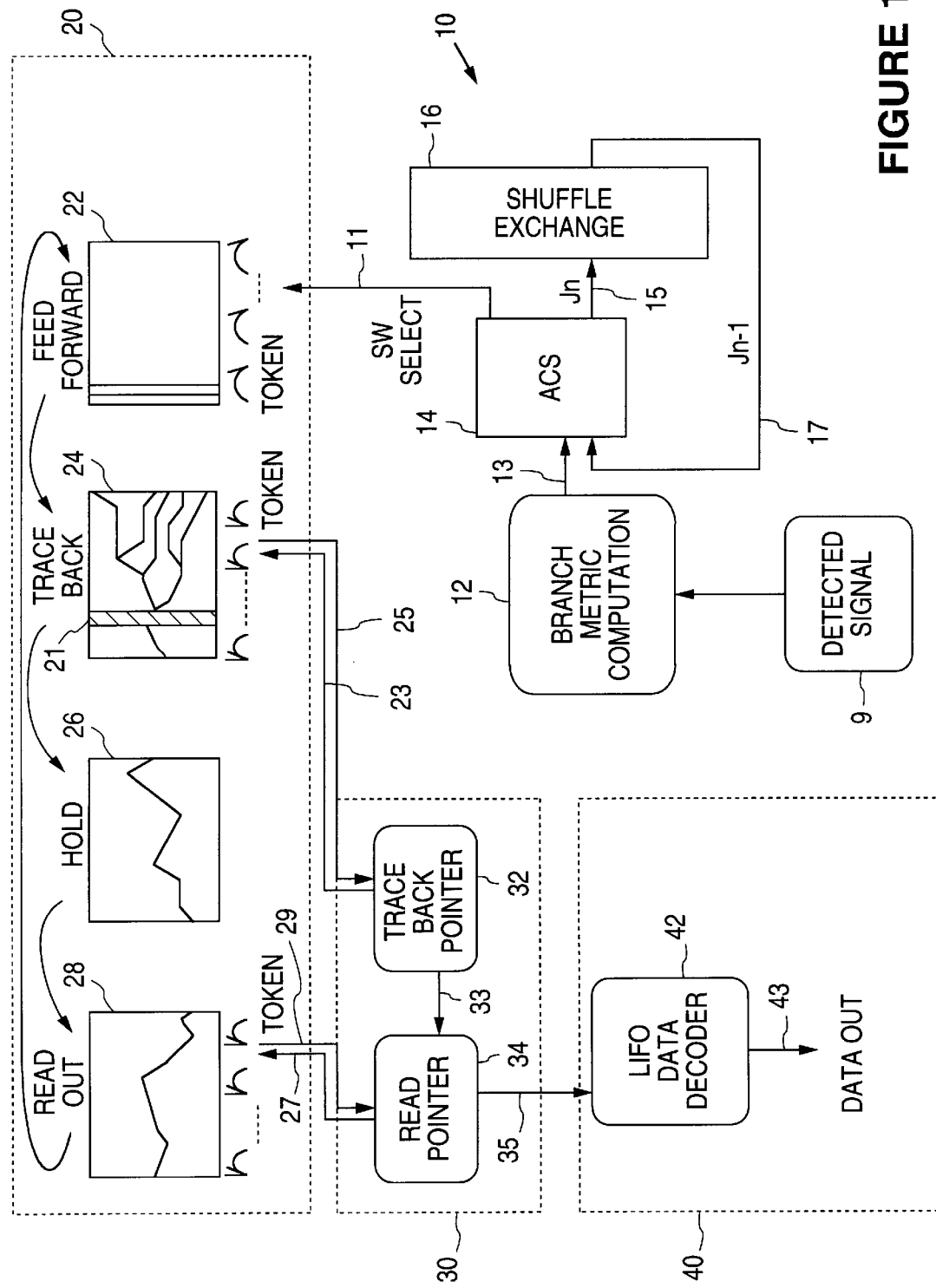
FIG. 1 is a functional block diagram of a Viterbi detector using Viterbi decoder circuit in accordance with one embodiment of the present invention.
Figure 2A:
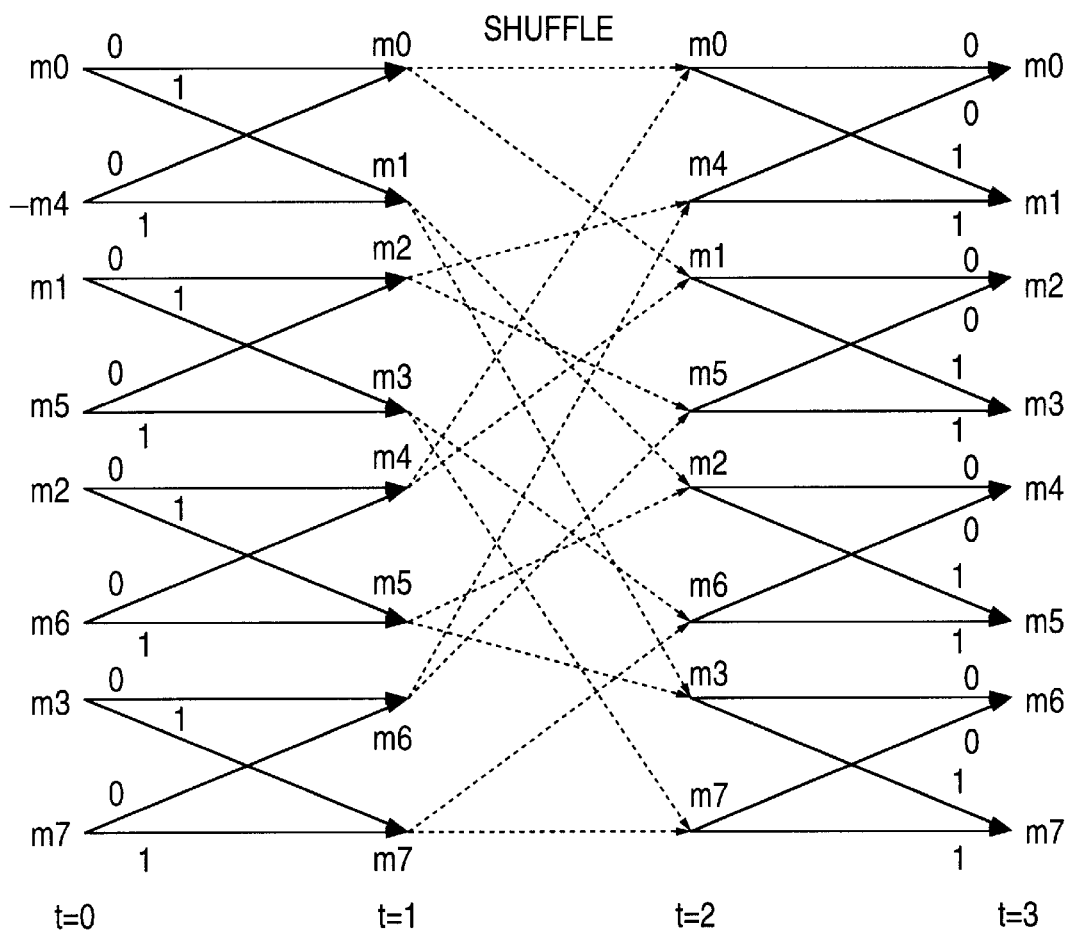
FIG. 2A is a state change diagram for a Viterbi detection algorithm.

Referring to FIG. 1, a Viterbi detector containing a Viterbi decoder circuit in accordance with one embodiment of the present invention includes an input stage 10, a configurable memory 20, a memory addressing stage 30 and a data decoding stage 40, all interconnected substantially as shown. The input stage 10 receives the detected signal 9 from the data channel (not shown) and processes it according to a branch metric computation 12. The result 13 of this computation contains the branch metrics of the detected signal 9 and is used in an ACS (add, compare and select) stage 14 for comparison against a prior state signal 17 from a shuffle exchange stage 16. This produces a present state signal 15 which is retained for later use by the shuffle exchange 16 and ACS 14 stages, plus a data signal (SWS select) 11 which is stored in the memory 20. These branch metric computation, and comparing and select and shuffle exchange operations are performed in accordance with well-known techniques and produce the data signal 11 in accordance with the metric computations algorithm as represented in FIG. 2A and below in Table 1.

TABLE 1

| $J_n(bbb) = MAX\{J_{n-1}(aaa)\}$ | SW Select | Adder Input |
|---|---|---|
| $J_n(000) = J_{n-1}(000) + 2$ | 0 | 1y |
| $= J_{n-1}(100) - 2y_k$ | 1 | 1x |
| $J_n(001) = J_{n-1}(000) + 2y_k$ | 0 | 2y |
| $= J_{n-1}(100) + 2$ | 1 | 2x |
| $J_n(010) = J_{n-1}(001) + 2y_k$ | 0 | 1y |
| $= J_{n-1}(101) + 2$ | 1 | 1x |
| $J_n(011) = J_{n-1}(001) + 4y_k - 6$ | 0 | 2y |
| $= J_{n-1}(101) + 2y_k$ | 1 | 2x |
| $J_n(100) = J_{n-1}(010) - 2y_k$ | 1 | 1x |
| $= J_{n-1}(110) - 4y_k - 6$ | 0 | 1y |
| $J_n(101) = J_{n-1}(010) + 2$ | 1 | 2x |
| $= J_{n-1}(110) - 2y_k$ | 0 | 2y |
| $J_n(110) = J_{n-1}(011) + 2$ | 0 | 1y |
| $= J_{n-1}(111) - 2y_k$ | 1 | 1x |
| $J_n(111) = J_{n-1}(011) + 2y_k$ | 0 | 2y |
| $= J_{n-1}(111) + 2$ | 1 | 2x |

Figure 2B:
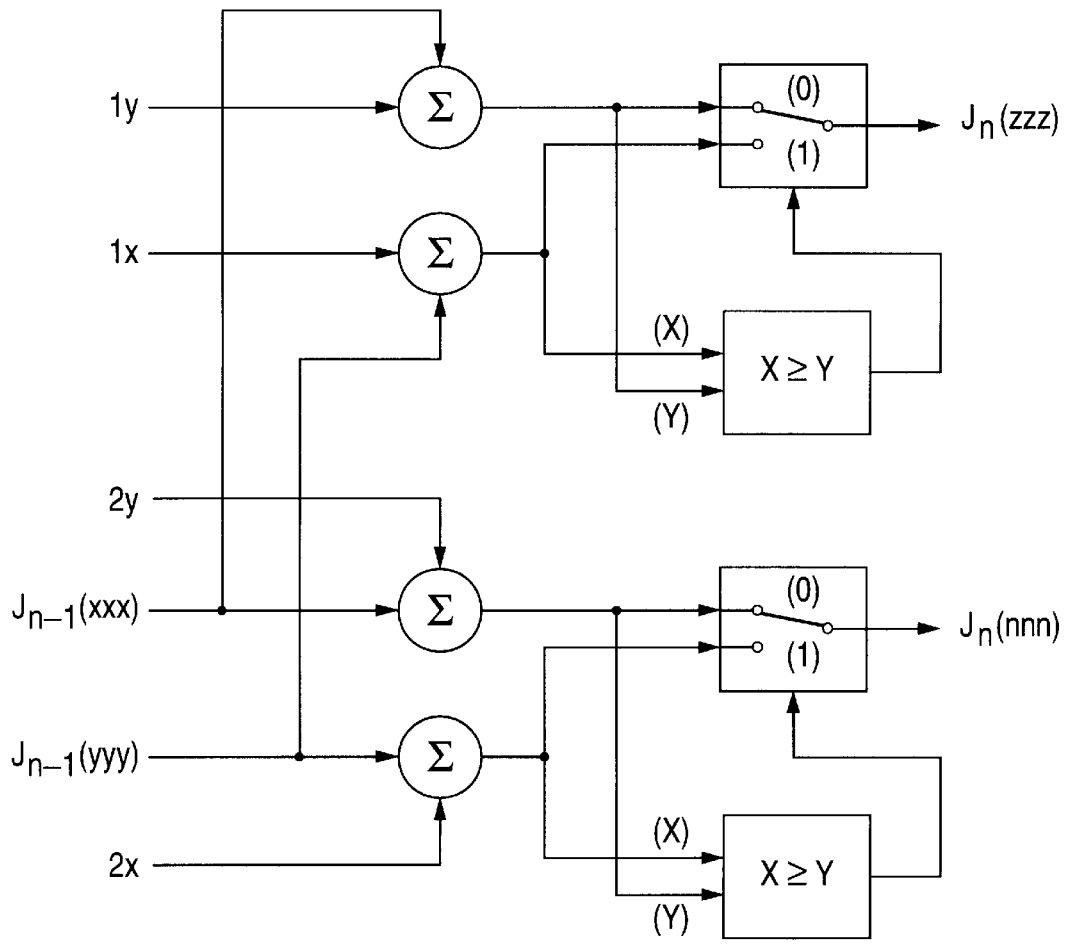
FIG. 2B is a functional block diagram of the ACS stage of FIG. 1.

The parameter $y_k$ is the value of the detected signal 9, including the data signal and noise. Referring to FIG. 2B, the "adder input" is used to associate branch metrics with Viterbi states for the Radix-2 ACS stage 14. For example, with reference to FIG. 2B and Table 1, each time a winning path is identified, the outputs of the comparison stages $X \geq Y$ are set to either a logic 0 or logic 1, depending upon the output of the metrics and prior state of the path. A logic 1 at the output of a comparison stage $X \geq Y$ not only identifies the winning path but also the most significant bit (MSB) of the previous state. Hence, as between two inputs with previous states of $m_0(000)$ and $m_4(100)$, a logic 1 at the output of the comparison stage $X \geq Y$ will cause selection of $m_4(100)$ and a 1 will be retained for use by a trace back circuit (discussed in more detail below).

The operation of the configurable memory 20 is as follows. The memory 20 has four configurations in which various portions of the memory 20 operate in a different manner. Each of these four different functional operations is performed at all times, albeit by a different portion 22/24/26/28 of the memory 20. One operation is that of feed forward in which one portion 22 of the memory 20 receives and stores the incoming data 11. Another portion 24 operates as a trace back stage by receiving an address signal 23 and reading out the data 25 stored at such address location. A third portion 26 operates as a hold stage by simply holding its stored data for subsequent addressing and retrieval when this portion 26 later operates as a trace back stage (24). The last portion 28 operates as a readout stage by reading out data 29 stored at the address location specified by an input address signal 27.

Within the addressing stage 30, a trace back pointer stage 32 generates the addressing signal 23 for the trace back stage 24. The initial starting address 23 can be arbitrarily selected, while subsequent addresses 23 are determined in accordance with the data 25 retrieved from the trace back stage 24 (discussed in more detail below). Following a number of successive cycles of addressing and reading out data from the trace back stage 24, the trace back pointer 32, when convergence 21 has occurred, sends an addressing control signal 33 to a read pointer stage 34. In accordance with such control information, the read pointer stage 34 addresses the readout stage 28 within the memory 20 and retrieves the corresponding data 29. This data is passed on as a data output signal 35 to the data decoder stage 42 which operates as a last-in, first-out (LIFO) memory for producing the final output data 43. Since data has been read out from the readout stage 28 in reverse order, a LIFO operation by the data decoder 42 is required for decoding purposes.

Figure 3:
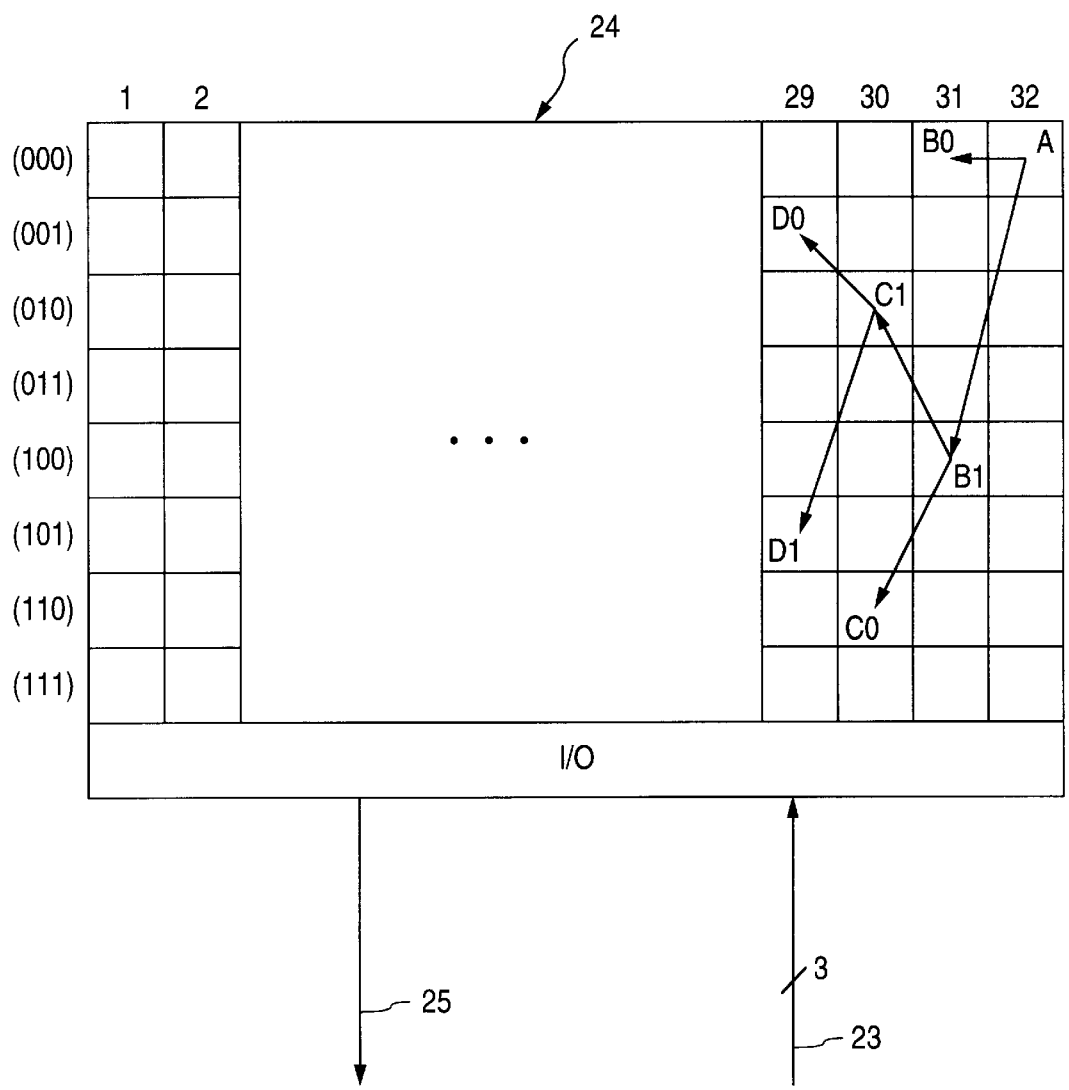
FIG. 3 represents the memory structure and addressing technique used in a Viterbi decoder circuit in accordance with one embodiment of the present invention.

Referring to FIG. 3, the operation of the trace back stage 24 of the memory 20 is as follows. As discussed above, the input address signal 23 addresses the individual bits within each byte of information. For example, if the initial address is at location 000 within byte 32, the value of that bit A is read out as the output data 25. In accordance with Table 1 above, if the bit A has a value of 1, the next address 23 causes the bit B1 at address 100 within byte 31 to be accessed, while if the bit A value is 0, the bit B0 at address 000 within byte 31 is accessed. Similarly, if the accessed bit B1 at address 100 in byte 31 has a value of 0, the next address will access the bit C0 at address 010 in byte 30. This process is repeated throughout the remaining columns (or rows) of the trace back memory stage 24. Hence, it can be seen that the addressing information inherently contained within the stored data can be advantageously used to help achieve a merged path in accordance with the Viterbi algorithm model.

Based upon the foregoing and with reference to FIGS. 1 and 3 and Table 1, the operation of a Viterbi detector using a Viterbi decoder circuit in accordance with a present invention can be summarized as follows. While it can be shown that the number of stages required to produce a merged path according to the Viterbi algorithm is in the range of 4 to 5 times of the constraint length, using even more stages can virtually guarantee the occurrence of a merge. For example, in the case of EPR4 the constraint length is 4. Accordingly, 20 stages should generally be sufficient. However, using a greater number of stages, such as 32, should virtually guarantee the occurrence of a merge. Accordingly, the memory 20 ideally, though not necessarily, provides 4 blocks 22, 24, 26, 28 of 32 stages (e.g., bytes, columns or rows) each.

The data 11 is stored into the feed forward stage 22 one column (or row or byte) at a time. Meanwhile, the trace back stage 24 traces back to find the merged path at some point in time, in a manner which is analogous to a pointer. Meanwhile, the hold stage 26 holds its data so that synchronization will follow smoothly. The readout stage 28 reads out its data for decoding.

When the feed forward stage 22 has completed writing data into its registers, the trace back stage 24 pointer will have found the merged path. At the same time, the read out stage 28 will have sent the last bit of its data for decoding. Before the next clock cycle starts, the trace back pointer 23 is passed to the readout pointer 27 (via the read pointer control signal 33). Accordingly, at the next clock cycle, the memory 20 becomes reconfigured: the feed forward 22, trace back 24, hold 26 and readout 28 stages, now become reconfigured to operate as trace back 24, hold 26, readout 28 and feed forward 22 stages, respectively. The new feed forward stage will now start writing data into what was previously the readout stage, and thereby write over what is now useless data presently stored therein. The trace back stage will start from one of its eight states and trace back to find a merge.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a Viterbi decoder circuit for decoding an encoded data signal containing Viterbi branch metric information, said Viterbi decoder circuit comprising:

a configurable memory circuit which includes a plurality of portions individually and alternately configured to operate as a respective one of first, second and third memory stages and which is configured to receive an encoded data signal and to receive first and second address signals and in accordance therewith provide first and second data signals, respectively, wherein said encoded data signal includes a plurality of input data sets, said first and second address signals represent first and second pluralities of memory addresses, respectively, within said configurable memory circuit, said first and second data signals contain first and second pluralities of data sets, respectively, said first memory stage is configured to store each one of a portion of said plurality of input data sets individually in a respective portion thereof, said second memory stage is configured to provide a portion of a first previously stored portion of said plurality of input data sets from one of said first plurality of memory addresses as one of said first plurality of data sets, and said third memory stage is configured to provide a portion of a second previously stored portion of said plurality of input data sets from one of said second plurality of memory addresses as one of said second plurality of data sets; and a data addressing circuit, coupled to said configurable memory circuit, configured to provide said first address signal and in accordance therewith receive said first data signal and in accordance therewith provide said second address signal and in accordance therewith receive and decode said second data signal and in accordance therewith provide an output data signal, wherein each one of said first plurality of memory addresses corresponds dynamically to a respective preceding one of said first plurality of data sets.

2. The apparatus of claim 1, wherein said data addressing circuit comprises:

a trace back pointer circuit configured to provide said first address signal and in accordance therewith receive and process said first data signal and in accordance therewith provide a read address control signal; and a decoder circuit, coupled to said trace back pointer circuit, configured to receive said read address control signal and in accordance therewith provide said second address signal and in accordance therewith receive and decode said second data signal and in accordance therewith provide said output data signal.

3. The apparatus of claim 1, wherein:

said plurality of portions of said configurable memory circuit are further individually and alternately configured to operate as a respective one of said first, second and third memory stages and a fourth memory stage; and said fourth memory stage is configured to hold for a predetermined period of time a previously stored portion of said plurality of input data sets for subsequent access by said first address signal and selective outputting as said first plurality of data sets.

4. The apparatus of claim 1, wherein each one of said plurality of input data sets contains address information corresponding to a Viterbi trellis address.

5. The apparatus of claim 1, further comprising an encoder circuit, coupled to said configurable memory circuit, configured to receive and encode a serial data stream and in accordance therewith provide said encoded data signal.

6. The apparatus of claim 5, wherein said encoder circuit comprises:

a branch metric computation circuit configured to receive said serial data stream and in accordance therewith provide a present branch metric signal representing a plurality of present Viterbi trellis branch metric information; and a branch metric processing circuit, coupled to said branch metric computation circuit, configured to receive and process said present branch metric signal with a prior branch metric signal representing a plurality of prior Viterbi trellis branch metric information and in accordance therewith provide said encoded data signal.

7. A method of decoding an encoded data signal containing Viterbi branch metric information, comprising the steps of:

electrically configuring a plurality of portions of a configurable memory circuit to individually and alternately operate as a respective one of first, second and third memory stages;

receiving an encoded data signal which includes a plurality of input data sets;

storing each one of a portion of said plurality of input data sets individually in a respective portion of said first memory stage;

generating a first address signal which represents one of a first plurality of memory addresses within said second memory stage;

outputting from said one of said first plurality of memory addresses within said second memory stage a first data signal which includes as one of a first plurality of data sets a portion of a first previously stored portion of said plurality of input data sets;

generating in accordance with said first data signal a second address signal which represents one of a second plurality of memory addresses within said third memory stage;

outputting from said one of said second plurality of memory addresses within said third memory stage a second data signal which includes as one of a second plurality of data sets a portion of a second previously stored portion of said plurality of input data sets; and decoding said second data signal and in accordance therewith generating an output data signal, wherein each one of said first plurality of memory addresses corresponds dynamically to a respective preceding one of said first plurality of data sets.

8. The method of claim 7, wherein said step of generating in accordance with said first data signal a second address signal which represents one of a second plurality of memory addresses within said third memory stage comprises:

processing said first data signal and in accordance therewith generating a read address control signal; and receiving said read address control signal and in accordance therewith generating said second address signal.

9. The method of claim 7, further comprising the steps of:

electrically configuring said plurality of portions of said configurable memory circuit to individually and alternately operate as a fourth memory stage; and hold for a predetermined period of time in said fourth memory stage a previously stored portion of said plurality of input data sets for subsequent access by said first address signal and selective outputting as said first plurality of data sets.

10. The method of claim 7, wherein said step of receiving an encoded data signal which includes a plurality of input data sets comprises receiving an encoded data signal which includes a plurality of input data sets containing address information corresponding to a Viterbi trellis address.

11. The method of claim 7, further comprising the step of receiving and encoding a serial data stream and in accordance therewith generating said encoded data signal.

12. The method of claim 11, wherein said step of receiving and encoding a serial data stream and in accordance therewith generating said encoded data signal comprises:

receiving said serial data stream and in accordance therewith generating a present branch metric signal which represents a plurality of present Viterbi trellis branch metric information; and processing said present branch metric signal with a prior branch metric signal which represents a plurality of prior Viterbi trellis branch metric information and in accordance therewith generating said encoded data signal.

* * * * *